(12) United States Patent
Schmidt

(10) Patent No.: US 7,898,378 B2
(45) Date of Patent: Mar. 1, 2011

(54) MAGNETIC RESONANCE DEVICE

(75) Inventor: Martin Schmidt, Emskirchen (DE)

(73) Assignee: Siemens Aktiengesellschaft, Munich (DE)

( * ) Notice: Subject to any disclaimer, the term of this patent is extended or adjusted under 35 U.S.C. 154(b) by 775 days.

(21) Appl. No.: 11/903,455

(22) Filed: Sep. 21, 2007

(65) Prior Publication Data

US 2008/0079529 A1 Apr. 3, 2008

(30) Foreign Application Priority Data

Sep. 29, 2006 (DE) .................. 10 2006 046 775

(51) Int. Cl.
*H01F 27/30* (2006.01)
(52) U.S. Cl. ..................................... 336/198
(58) Field of Classification Search ............ 336/65, 336/83, 200, 206–208, 223, 232, 196, 198, 336/90–96; 335/216
See application file for complete search history.

(56) References Cited

FOREIGN PATENT DOCUMENTS

| JP | 64-079 064 A | | 3/1989 |
|---|---|---|---|
| JP | 05154124 A | * | 6/1993 |
| JP | 11-121 224 A | | 4/1999 |

OTHER PUBLICATIONS

German Office Action dated May 9, 2007 and English translation.

* cited by examiner

*Primary Examiner*—Tuyen Nguyen
(74) *Attorney, Agent, or Firm*—Brinks Hofer Gilson & Lione

(57) ABSTRACT

A coil for a magnetic resonance device is provided. The coil includes a cylindrical coil insulating frame with at least one winding groove running around its circumference, at least one coil conductor wound into the winding groove around the coil insulating frame, and one electrically-insulating insulator lining the winding groove and insulating the coil insulating frame and the coil conductor from each other. The insulation includes a number of molded insulating segments that line the winding groove, supplementing each other to form a circular ring which matches the cross-sectional shape of the winding groove.

15 Claims, 3 Drawing Sheets

MAGNETIC RESONANCE DEVICE

This application claims the benefit of DE 10 2006 046 775.2, filed Sep. 29, 2006, which is hereby incorporated by reference.

BACKGROUND

The present embodiments relate to a coil for a magnetic resonance device.

Magnetic resonance devices with cylindrical magnets may include a number of cylindrical superconducting coils, which are used for magnetic field generation or field homogenization or screening. The cylindrical superconducting coils may be, for example, primary coils or shim coils. The cylindrical superconducting coils are formed for cylindrical magnets by a cylindrical coil insulating frame that may be made of metal. Since only by using a metal coil insulating frame can it be ensured that only minimal changes occur to the geometry of the coil through shrinkage of the coil insulating frame when the coil is cooled down to reach its superconducting state. One or more coil grooves are provided on the coil insulating frame, which run around its outer side and open radially outwards. These grooves are milled into the coil insulating frame with the desired geometry. To electrically insulate the coil insulating frame from a coil conductor wound into one of these grooves, insulation is applied which acts as a lining for the groove. Subsequently, the coil conductor, which may be made from superconducting material, is wound in.

For known coils with metallic coil insulating frames, the insulation is manufactured using an insulating film that is wound as a number of layers into the groove. If this has to be manipulated further on the floor of the rectangular cross-section groove, considerable difficulties arise in covering the sides of the groove, both regarding the covering of the actual groove sides and in establishing an insulating transition between the groove edge insulation and the floor insulation. The insulation must be applied exactly since in the event of a fault it can be subjected to high voltages, which must be isolated to avoid damaging the magnet. These high voltages are in the range of several kV. The insulation must be applied without creases and air bubbles, since these types of faults can lead to reduced insulation which may be able to be punctured by voltages. The films to be used may have faults. For example, the films can have small tears or holes, which may lead to problems during operation. The films able to be used for this purpose are expensive.

SUMMARY

The present embodiments may obviate one or more of the limitations or drawbacks inherent in the related art. For example, in one embodiment, a coil, which is significantly simpler to manufacture, has the required insulating characteristics.

In one embodiment, a coil for a magnetic resonance device includes a cylindrical coil insulating frame with at least one winding groove running around its outer circumference, at least one coil conductor wound into the winding groove around the coil insulating frame, and insulation that lines the winding groove and electrically insulates the coil insulating frame and the coil conductor from each other.

In one embodiment, the insulation consists of a number of molded segments added to each other to form a ring, matching the cross-sectional shape of the winding groove, which line the winding groove.

In one embodiment, insulation, for a coil, is formed from a number of molded insulation segments that are sufficiently rigid. The totality of the individual insulation segments forms a circular ring that corresponds to the circumference and the geometry of the winding groove, i.e. the totality of the insulation segments inserted into the winding groove completely lines the winding groove. During the installation process, it is only necessary to insert the insulation segments into the winding groove. The groove is then completely insulated, after which only the coil conductor wire still has to be wound in.

The insulation segments make manufacturing the insulation considerably simpler than was previously possible. For example, no particular expense has to be incurred as a result of the cross-sectional shape of the winding groove. Faults occurring while establishing the insulation produced by winding-in the insulating film are also excluded. The individual insulating segments may be easily checked prior to fitting in respect of their quality and insulating capability, so as to ensure that only good insulating segments will be inserted.

The cross-sectional geometry of the winding groove may include any shape. For example, the winding groove can have a curved form when viewed in cross section. Alternatively, the winding groove may include a rectangular cross section, with the insulating segment simultaneously having a matching cross section and having a floor section and two side sections standing at right angles to it. The cross-sectional geometry of an insulating segment corresponds to the cross-sectional geometry of the winding groove so that all groove surfaces have a complete, exact, and close-fitting lining. Other groove and segment geometries are conceivable. An insulating segment may be a molded plastic part, such as a plastic injection molded part. Any type of plastic may be used, which has the desired insulating properties for the given wall thicknesses of an insulating segment. A transparent plastic may be used. A transparent plastic enables any locations of faults or short circuits to be detected by a simple optical check. Polyamide (PA) may be used as the plastic, for example, but it is also conceivable to use other plastics.

In one embodiment, edge sections are provided on an insulating segment that runs (extends) in parallel to the longitudinal axis of the coil insulating frame and extends over the coil insulating frame at the edge of the groove. Via these edge sections the insulation is slightly drawn out over the surface of the coil insulating frame, and the entry and exit of the coil conductor into the winding groove and from the winding groove may be laid insulated on the surface of the coil insulating frame.

In one embodiment, the winding groove includes a side extension that is embodied in the shape of a milled-out side pocket. The side extension may be used for entry and exit of the coil conductor. In one embodiment, a sideways extension may be embodied on an insulation segment which lines the side extension of the groove, corresponding exactly to its shape. Since such a side groove extension is only embodied at one location of the winding groove, such a sideways extension need only be provided on one insulation segment as well.

In one embodiment, an insulating segment extends over an angle of at least 30°, for example, at least 45°. The greater the angle, the fewer insulating segments that are required. For example, an insulating segment that extends over 90° may only require four insulating segments to form the insulating ring. In another example, a 180° version only needs two insulating segments to form the insulating ring.

In one embodiment, joints at two adjoining insulating segments will be produced when prefabricated insulating segments are used. The end areas of the insulating segments may be designed so that the insulating segment ends of two adjoining insulating segments overlap so that they thus almost produce two overlaid segment insulation layers. This is possible by halving the wall thickness of each insulating segment in its end area and embodying the adjoining edge sections accordingly in their geometry so that they overlap for a given wall thickness reduction but no step is produced. As an alternative to at least overlapping sections of the segments the joints of the insulating segments may be covered at least with a band of flexible insulation, such as an insulating film. In this area, for example, an insulating film is used in this alternative, which is only to be laid in a short section viewed axially in order to cover the joint. This may be secured, for example by gluing, or using a self-adhesive insulating film, an adhesive fixing by using an adhesion film is also conceivable. Welding-on using a plastic welding method is also possible.

The present embodiments also relate to a magnetic resonance device including at least one coil of the type described.

DETAILED DESCRIPTION

Figure 1:
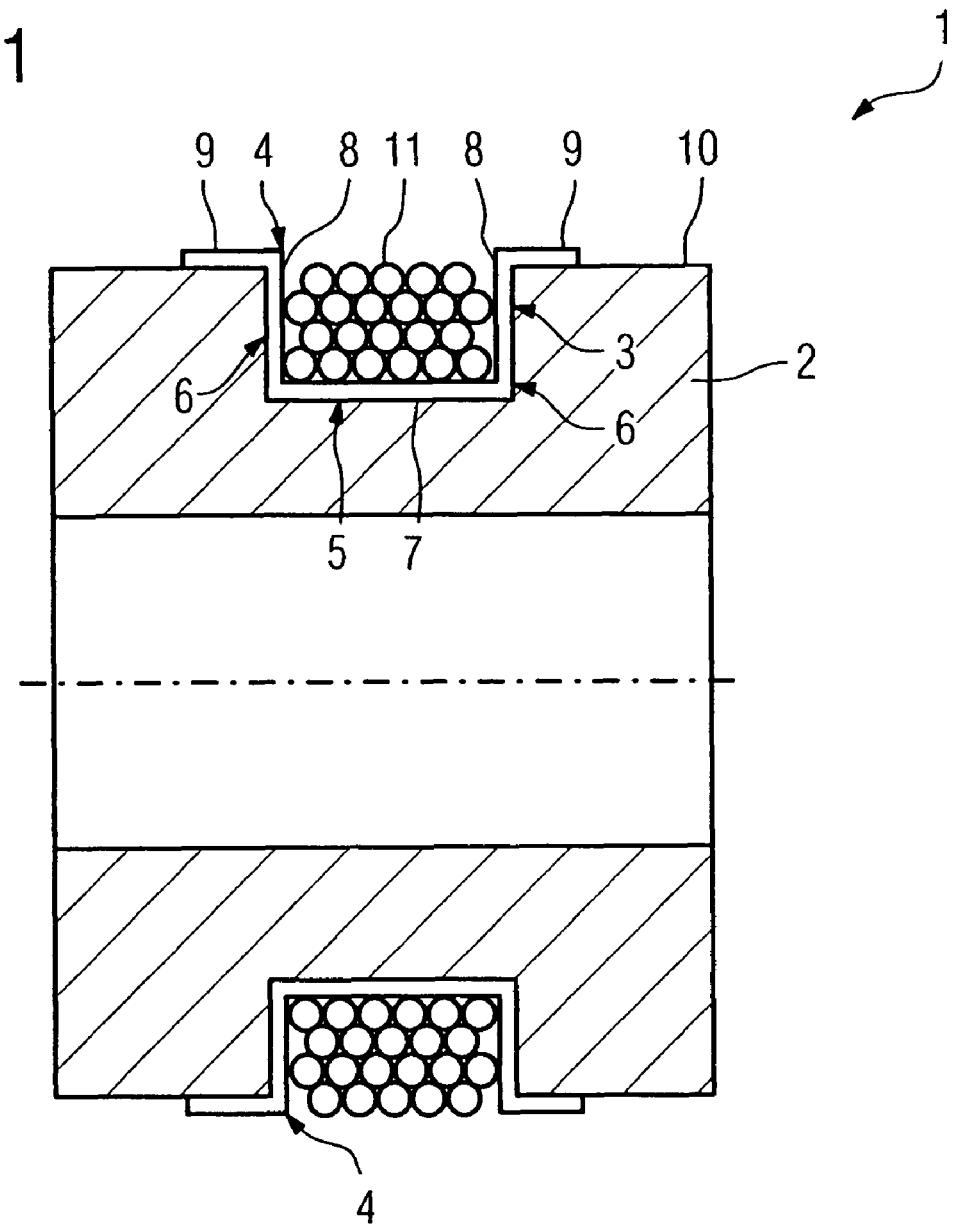
FIG. 1 illustrates one embodiment of a coil of a magnetic resonance system in a cross-sectional diagram.

In one embodiment, as shown in FIG. 1, a superconducting coil 1 of a magnetic resonance device may be, for example, a primary coil or shim coil. The superconducting coil 1 includes a metal coil insulating frame 2, which may be cylindrical in shape. A rectangular-cross section winding groove 3 runs around the circumference and opens outwards. A primary coil includes only one winding groove 3. A shim coil includes a number of winding grooves 3 arranged alongside each other, i.e., axially offset. A number of individual insulating segments 4 are placed into this winding groove 3 in order to fully line the winding groove 3. Only two winding grooves are shown in FIG. 1 since the figure shows a cross-sectional view. A number of separate insulating segments may be used, depending on the angle enclosed by an insulating segment 4. The insulating segments supplement each other to form a circular ring. If, for example, insulating segments 4 covering an angle of 30° are used, a total of twelve insulating segments are required. In another example, with insulating segments extending over 45°, eight insulating segments are used.

In one embodiment, the cross-sectional shape of an insulating segment 4 corresponds exactly to the cross-sectional shape of a winding groove 3. The winding groove 3 is rectangular and has a groove floor 5 and two groove sides 6. Each insulating element 4 has a floor section 7 and two side edge sections 8 at right angles to the floor section 7. In the exemplary embodiment shown in FIG. 1, the side sections 8 turn into axially extending edge sections 9, which rest after installation on the surface 10 of the coil insulating frame 2. Accordingly, the insulation extends onto the surface 10 of the coil insulating frame 2. For example, if an insulating segment 4 is inserted into the winding groove 3, this groove 3 will be completely lined and, since the size of an insulation segment 4 is tailored exactly to the size of the winding groove, the lining will form a close fit. In the area where two adjoining insulation segments 4 meet, a band of insulating film that covers and insulates the joint is applied, for example, glued on. The insulating film extends along the axis of the coil insulating frame and thus also enables complete insulation in the joint area.

Figure 5:
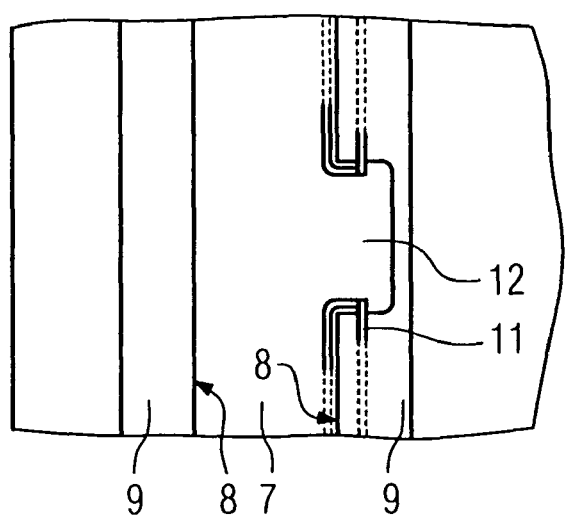

After application of the insulation consisting of the number of insulating segments 4 into the winding groove 3, the wire-type, such as the superconducting coil conductor 11 is wound on, which is fed from outside, lying on one of the edge sections 9, over a suitable side extension 12, which is provided in the winding groove 3 and is also formed into the insulating segment 4 precisely matching its geometry, as is shown in the basic diagram in FIG. 5. The coil conductor is wound on and its leading end is subsequently brought out of the side extension 12 again. The complete insulation is provided in this area too.

Figure 2:
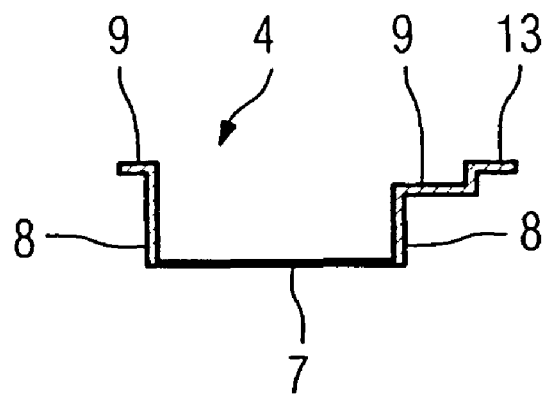
FIG. 2 illustrates one embodiment of an insulating segment.

FIG. 2 shows a more detailed cross-sectional view of an insulation segment 4. In one embodiment, as shown in FIG. 2, the floor section 7 is much thinner than the side sections 8. For example, the wall thickness of the floor section 7 is one millimeter or less, such as approximately 0.8 mm, whereas the wall thickness of an edge section, for example, is approximately 3.5 mm, such as 3 mm or greater. The edge sections 9, of which the wall thickness is, for example, 3.5 mm or 3 mm or greater.

In one embodiment, an edge section 13 may be a stepped section that adjoins the edge section 9 which is depicted on the right in FIG. 2. For manufacturing a primary coil, which only has one winding groove, the edge section 13 may not be needed. For manufacturing a shim coil with a number of adjacent winding grooves to be lined, this step-shaped edge section may, however, be used to span the adjacent edge section 9 of an insulating segment 4 lining the parallel winding grooves.

Figure 3:
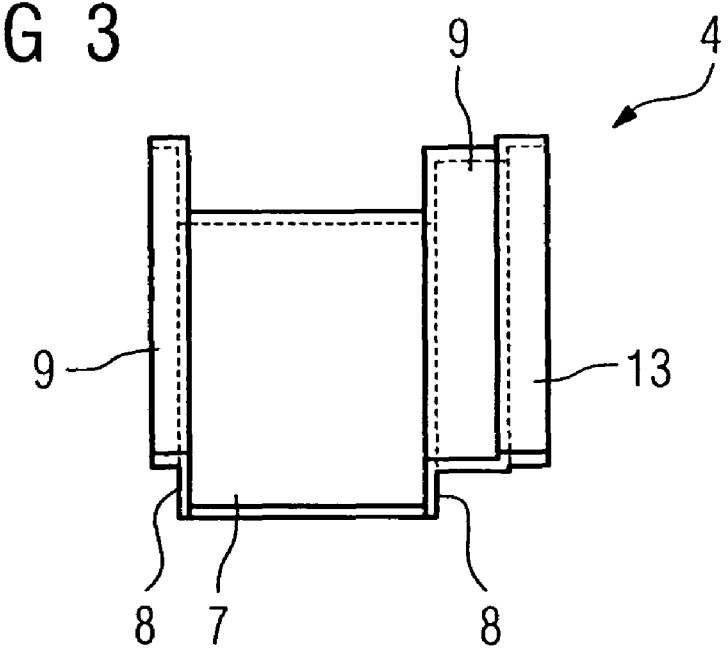
FIG. 3 is a side view of an insulating segment.

FIG. 3 shows a side view of an insulating segment 4, such as that shown in FIG. 2.

Figure 4:
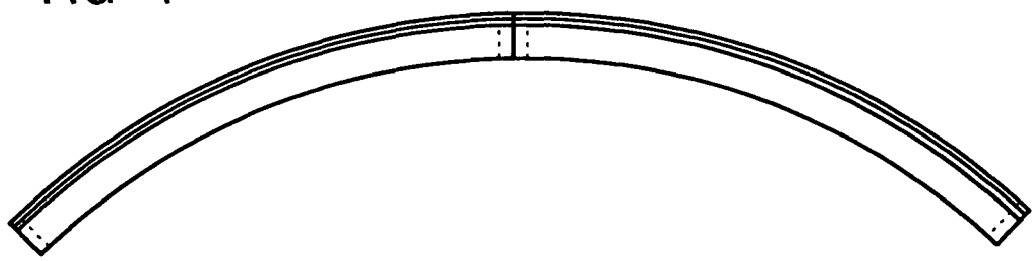
FIG. 4 is an end face view of one embodiment of an insulating segment, and FIG. 5 a view of the coil from FIG. 1 in the area of the side extension for entry and exit of the coil conductor.

FIG. 4 shows the corresponding end face view. The curved shape of such an insulating segment may be seen from this figure.

The insulating segments 4 may be molded plastic parts, for example, plastic injection-molded parts. A transparent plastic, such as Polyamide, may be used as the plastic, which allows optical quality control. As a result of the insulating segments 4 being embodied from plastic they are very easy to manufacture, also it is a simple matter to adapt them very exactly to both the geometry and the size of the winding groove.

Any suitable plastic exhibiting the required insulating characteristics can be used as the plastic. The plastic must exhibit a sufficient ductility at the operating temperature of around 4 K, to which the superconducting coil (the coil conductor is made from a superconducting material) is cooled, so that in this case and also during operation, no deformations arise, which may lead to cracks.

Various embodiments described herein can be used alone or in combination with one another. The forgoing detailed description has described only a few of the many possible implementations of the present invention. For this reason, this detailed description is intended by way of illustration, and not by way of limitation. It is only the following claims, including all equivalents that are intended to define the scope of this invention.

The invention claimed is:

1. A coil for a magnetic resonance device, the coil comprising:
a cylindrical coil insulating frame with at least one winding groove running around a coil circumference,
one or more coil conductors wound into the at least one winding groove around the coil insulating frame, and
an electrically insulating insulator lining the winding groove and insulating the coil insulating frame and the coil conductor from each other,
wherein the electrically insulating insulator comprises a plurality of molded insulating segments that line the winding groove and form a circular ring that matches the cross-sectional shape of the winding groove, and
wherein the cross-sectional shape of each molded insulating segment of the plurality matches the cross-sectional shape of the winding groove.

2. The coil as claimed in claim 1, wherein the winding groove is rectangular in cross section and the insulating segments including a floor section and two side sections that stand at right angles to the floor section.

3. The coil as claimed in claim 1, wherein the insulating segments include edge sections that extend on each side in parallel to the longitudinal axis of the coil insulating frame and cover the coil insulating frame at the edge of the groove.

4. The coil as claimed in claim 1, wherein a side extension includes an insulating segment that lines a side extension to the groove.

5. The coil as claimed in claim 1, wherein an insulating segment covers an angle of at least 30° of a circumference.

6. The coil as claimed in claim 1, wherein each insulation segment includes a molded plastic part.

7. The coil as claimed in claim 6, wherein the insulating segments include a transparent plastic.

8. The coil as claimed in claim 1, wherein joints of the insulating segments are covered by a band of flexible insulation.

9. The coil as claimed in claim 1, wherein two insulating segments overlap at least in sections in an area in which they join.

10. A magnetic resonance device, comprising:
at least one coil;
the at least one coil including a cylindrical coil insulating frame with at least one winding groove running around a coil circumference,
one or more coil conductors wound into the at least one winding groove around the coil insulating frame, and
an electrically insulating insulator lining the winding groove and insulating the coil insulating frame and the coil conductor from each other,
wherein the electrically insulating insulator comprises a plurality of molded insulating segments that line the winding groove and form a circular ring that matches the cross-sectional shape of the winding groove, and
wherein the cross-sectional shape of each molded insulating segment of the plurality matches the cross-sectional shape of the winding groove.

11. The coil as claimed in claim 4, wherein the incoming or outgoing end of the coil conductor is routed in or out of the groove.

12. The coil as claimed in claim 5, wherein an insulating segment covers at least 45° of the circumference.

13. The coil as claimed in claim 1, wherein the molded plastic part includes an injection-molded plastic part.

14. The coil as claimed in claim 13, wherein the injection-molded plastic part includes a transparent plastic.

15. The coil as claimed in claim 8, wherein joints of the insulating segments are covered by an insulating film.

* * * * *